(12) United States Patent
Barnes et al.

(10) Patent No.: US 6,876,227 B2
(45) Date of Patent: Apr. 5, 2005

(54) SIMPLIFYING THE LAYOUT OF PRINTED CIRCUIT BOARDS

(75) Inventors: David Andrew Barnes, Pleasanton, CA (US); Walter Michael Pitio, Morganville, NJ (US)

(73) Assignee: Parama Networks, Inc., Santa Clara, CA (US)

( * ) Notice: Subject to any disclaimer, the term of this patent is extended or adjusted under 35 U.S.C. 154(b) by 530 days.

(21) Appl. No.: 10/112,099

(22) Filed: Mar. 29, 2002

(65) Prior Publication Data

US 2003/0183404 A1 Oct. 2, 2003

(51) Int. Cl.[7] .............................................. H03K 19/173
(52) U.S. Cl. ....................................... 326/38; 326/41
(58) Field of Search ...................................... 326/38–41

(56) References Cited

U.S. PATENT DOCUMENTS

| | | | | |
|---|---|---|---|---|
| 5,530,378 A | * | 6/1996 | Kucharewski et al. ........ 326/41 |
| 5,821,776 A | * | 10/1998 | McGowan ................... 326/41 |
| 5,903,165 A | * | 5/1999 | Jones et al. .................. 326/39 |
| 5,914,898 A | * | 6/1999 | Sher et al. ............. 365/189.05 |
| 6,204,686 B1 | * | 3/2001 | Agrawal et al. .............. 326/39 |
| RE37,195 E | * | 5/2001 | Kean ........................... 326/39 |
| 6,262,597 B1 | * | 7/2001 | Bauer et al. .................. 326/41 |
| 6,480,026 B2 | * | 11/2002 | Andrews et al. ............. 326/39 |

\* cited by examiner

Primary Examiner—Don Le
(74) Attorney, Agent, or Firm—DeMont & Breyer, LLC

(57) ABSTRACT

A method of simplifying the layout of a printed circuit board is disclosed that enables an integrated circuit to modify—after the integrated circuit is manufactured—which pads transport which signals. An integrated circuit in accordance with the illustrative embodiment comprises a two-dimensional array of pads. At the time that the integrated circuit is designed, some or all of the pads are assigned to one or more "transposition groups." One or more pads are included in a transposition group when, for example, it might be necessary or advantageous to transpose the signals carried by those pads after the integrated circuit has been manufactured. One or more of these transpositions can, for example, greatly simplify the layout of a printed circuit board.

14 Claims, 11 Drawing Sheets

US 6,876,227 B2

SIMPLIFYING THE LAYOUT OF PRINTED CIRCUIT BOARDS

FIELD OF THE INVENTION

The present invention relates to the layout of printed circuit boards in general, and, more particularly, to a technique that enables the layout of printed circuit boards to be greatly simplified.

BACKGROUND OF THE INVENTION

FIG. 1 depicts a schematic diagram of printed circuit board 100 on which are mounted two integrated circuits, integrated circuit 101 and integrated circuit 102, which are contained in dual in-line packages.

In accordance with the prior art illustration, some of the pins or pads on integrated circuit 101 are electrically tied, in well-known fashion, to some of the pads on integrated circuit 102. In particular:

pad 24 on IC 101 is connected to pad 8 on IC 102, and
pad 23 on IC 101 is connected to pad 9 on IC 102, and
pad 22 on IC 101 is connected to pad 9 on IC 102, and
pad 21 on IC 101 is connected to pad 10 on IC 102, and
pad 20 on IC 101 is connected to pad 1 on IC 102, and
pad 19 on IC 101 is connected to pad 2 on IC 102, and
pad 18 on IC 101 is connected to pad 7 on IC 102, and
pad 17 on IC 101 is connected to pad 6 on IC 102, and
pad 16 on IC 101 is connected to pad 5 on IC 102, and
pad 15 on IC 101 is connected to pad 4 on IC 102, and
pad 14 on IC 101 is connected to pad 3 on IC 102, and
pad 13 on IC 101 is connected to pad 12 on IC 102.

FIG. 1 depicts one possible layout of the printed leads on printed circuit board 100 for accomplishing the requisite interconnections between integrated circuit 101 and integrated circuit 102 on a two-layer printed circuit board. This topology of interconnections consumes a great deal of space on printed circuit board 100 and is disadvantageous in that it causes the impedance of some lines to be different than the impedance of some others. In contrast, if all of the printed leads between two integrated circuits were parallel, less space would be consumed on the printed circuit board and the impedance of adjacent leads would be similar.

In particular, the flipping of a bus (e.g., pads 14 through 18 on integrated circuit 101 to pads 3 through 7, respectively, on integrated circuit 102, etc.) on a printed circuit board makes the layout of the printed circuit board difficult. Therefore, the need exists for an improved technique for routing printed leads on printed circuit boards between integrated circuits.

SUMMARY OF THE INVENTION

The present invention simplifies the layout of a printed circuit board without some of the costs and disadvantages of doing so in the prior art. In particular, the present invention enables the layout of a printed circuit board to be simplified by enabling an integrated circuit to modify—after the integrated circuit is manufactured—which pads transport which signals. In other words, the present invention recognizes that although the geometry of an integrated circuit's pads is fixed, the assignment of signals to those pads need not be.

An integrated circuit in accordance with the illustrative embodiment comprises a two-dimensional array of pads. At the time that the integrated circuit is designed, some or all of the pads are assigned to one or more "transposition groups." One or more pads are included in a transposition group when, for example, it might be necessary or advantageous to transpose the signals carried by those pads after the integrated circuit has been manufactured. One or more of these transpositions can, for example, greatly simplify the layout of a printed circuit board.

The illustrative embodiment comprises: a first pad for transporting a first signal when the integrated circuit is in a first transposition mode and for transporting a second signal when the integrated circuit is in a second transposition mode; a second pad for transporting the second signal when the integrated circuit is in the first transposition mode and for transporting the first signal when the integrated circuit is in the second transposition mode; and a transposing multiplexor for routing the first signal to the first pad and the second signal to the second pad when the integrated circuit is in the first transposition mode and for routing the first signal to the second pad and the second signal to the first pad when the integrated circuit is in the second transposition mode.

DETAILED DESCRIPTION

Figure 1:
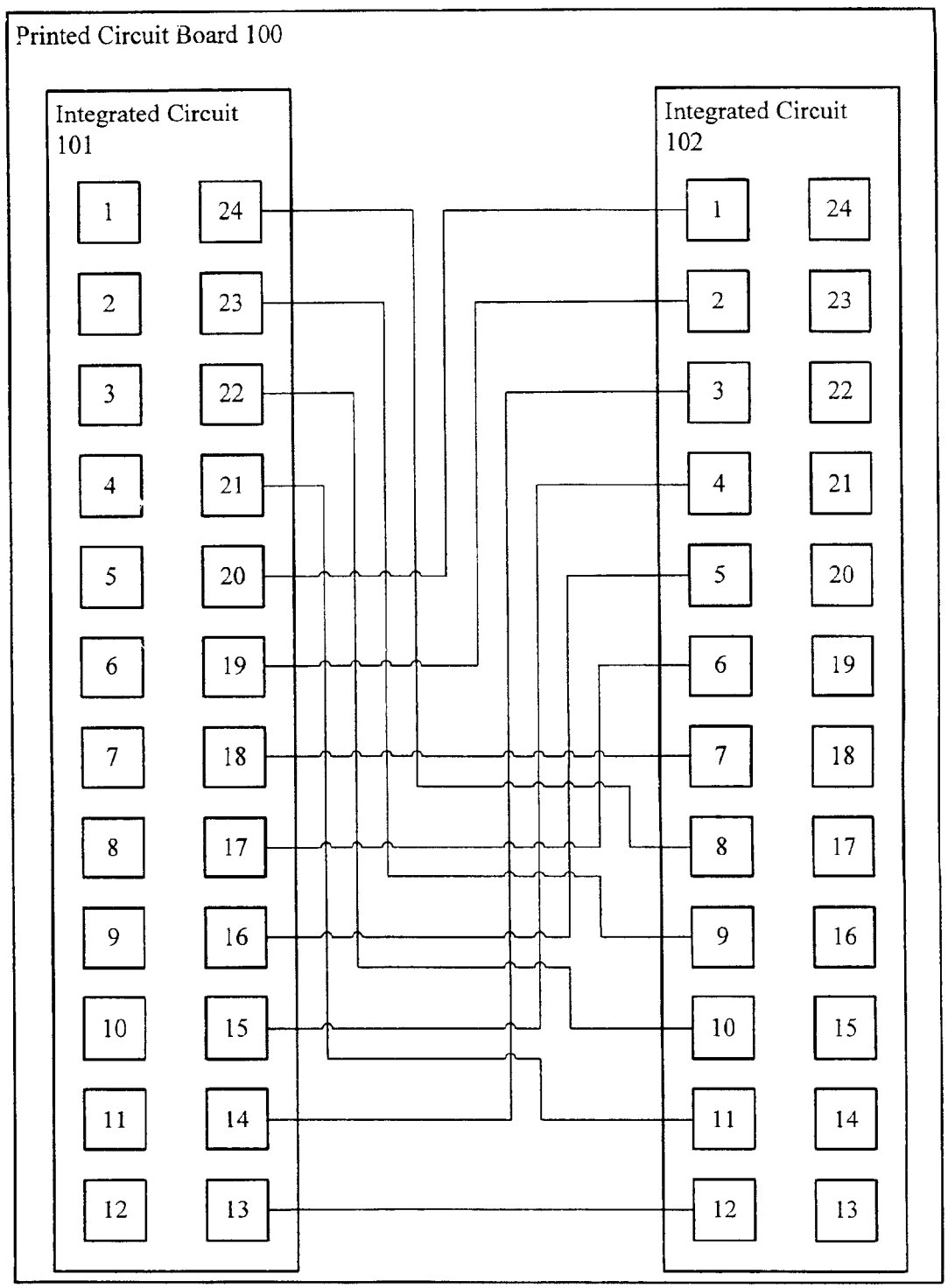
FIG. 1 depicts a schematic diagram of a printed circuit board in accordance with the prior art, on which are mounted two integrated circuits.
Figure 2:
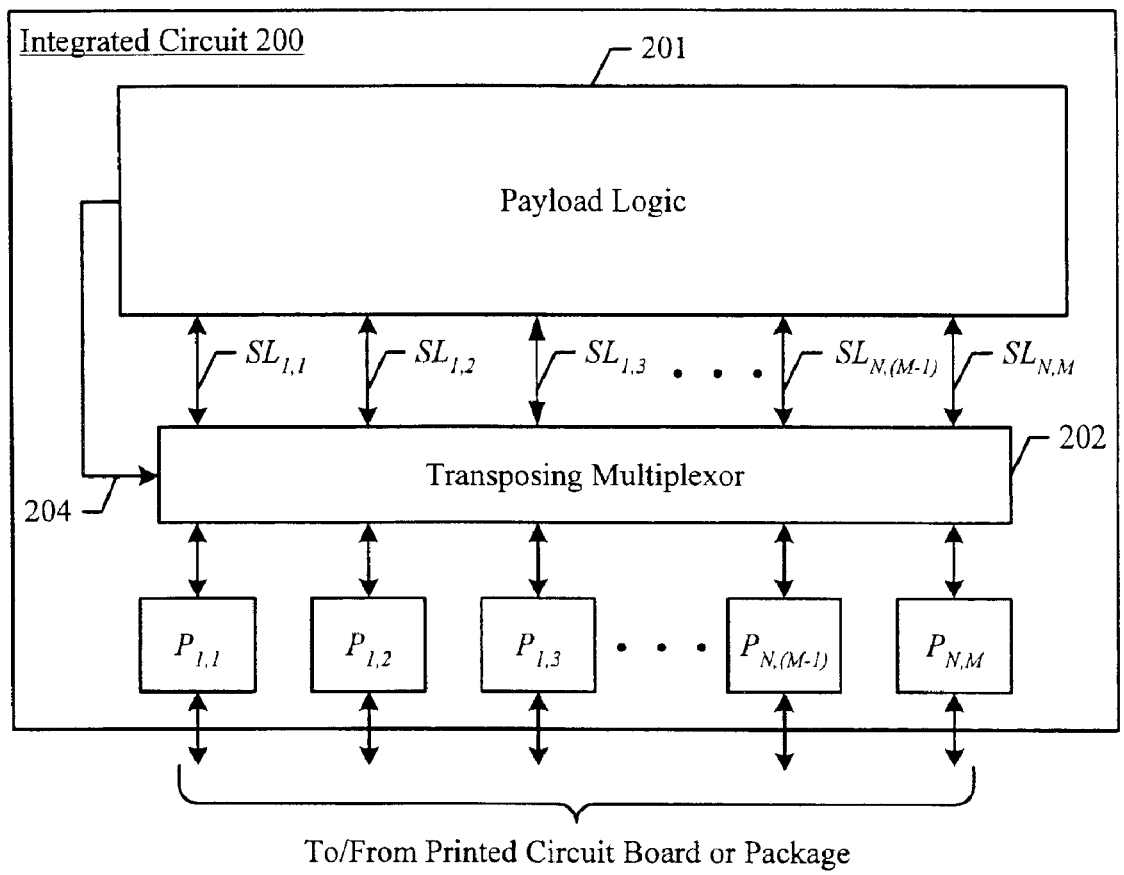
FIG. 2 depicts a block diagram of the salient components of an integrated circuit in accordance with the illustrative embodiment of the present invention.

FIG. 2 depicts a block diagram of the salient components of an integrated circuit in accordance with the illustrative embodiment of the present invention, which comprises payload logic 201, transposing multiplexor 202, an array of signal leads $S_{1,1}$ through $S_{N,M}$, and array of pads $P_{1,1}$ through $P_{N,M}$, wherein N and M are positive integers.

For the purposes of this specification, the term "integrated circuit" is defined as a slice or chip of material on which is etched or imprinted a complex of electronic components and their interconnections.

In accordance with the illustrative embodiment, N=8 and M=7. After reading this specification, it will be clear to those skilled in the art how to make and use alternative embodiments of the present invention in which N and M have other values.

Figure 3:
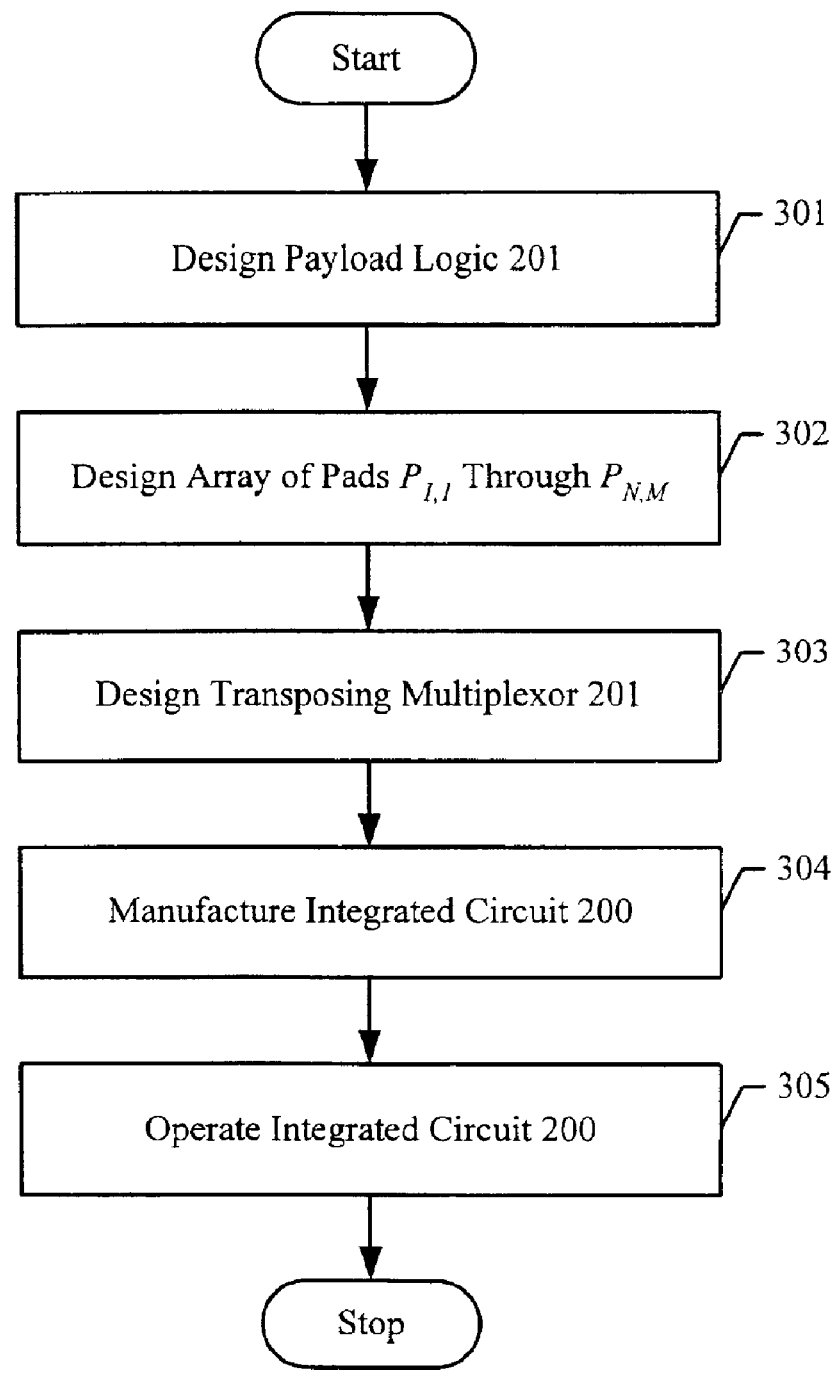
FIG. 3 depicts a flowchart of the tasks associated with designing and operating integrated circuit 200.

FIG. 3 depicts a flowchart of the tasks associated with designing and operating integrated circuit 200.

At task 301, payload logic 201 is designed in well-known fashion. As in the prior art, payload logic 201 is the circuitry for which integrated circuit 200 is designed and manufactured. For example, in accordance with the illustrative embodiment, integrated circuit 200 is designed to function as a Synchronous Optical Network (i.e., SONET) switch, and, therefore, payload logic 201 comprises a time-space-time division switch, a switch controller, and memory. After reading this specification, however, it will be clear to those skilled in the art how to make and use alternative embodiments of the present invention in which payload logic 201 performs another function.

In any case, payload circuitry 201 can comprise:
  i. digital circuitry, or
  ii. analog circuitry, or
  iii. both analog and digital circuitry.
In accordance with the illustrative embodiment, payload logic 201 processes a plurality of signals. Some of these signals are generated by payload logic 201 and are to be transported off of integrated circuit 200 (i.e., the signal is an "outgoing" signal), some of these signals are received by payload logic 201 from off of integrated circuit 200 (i.e., the signal is an "incoming" signal), and some of these signals are alternately generated by and received by payload logic 201 (i.e., the signal is bi-directional or alternates between being an incoming and outgoing signal).

For the purposes of this specification, each signal is identified with the signal lead in integrated circuit 200 that carries the signal. Therefore, even though the signals might not constitute a logical array in and of themselves, the plurality of signals are designated for pedagogical purposes as an array of signals $S_{1,1}$ through $S_{N,M}$, that are transported on signal leads $SL_{1,1}$ through $SL_{N,M}$, respectively.

As stated above, each of signals $S_{1,1}$ through $S_{N,M}$ is:
  i. generated by payload logic 201 and transported off of integrated circuit 200 via a signal lead, transposing multiplexor 202, and a pad (i.e., the signal is an "outgoing" signal), or
  ii. received by payload logic 201 from off of integrated circuit 200 via a signal lead, transposing multiplexor 202, and a pad (i.e., the signal is an "incoming" signal), or
  iii. both i and ii (i.e., the signal is bi-directional or alternates between being an incoming and outgoing signal).

Again, for pedagogical purposes, signal $S_{i,j}$ is always transported on signal lead $SL_{i,j}$, for i=1 through N and j=1 through M.

At task 302, pads $P_{1,1}$ through $P_{N,M}$ are designed and laid out in well-known fashion. As in the prior art, the pads are the means by which signals $S_{1,1}$ through $S_{N,M}$ are transported onto and off of integrated circuit 200. Each of pads $P_{1,1}$ through $P_{N,M}$ are capable of:
  i. transporting a signal off of integrated circuit 200 (i.e., the signal is an "outgoing" signal), or
  ii. transporting a signal onto integrated circuit 200 (i.e., the signal is an "incoming" signal), or
  iii. both i and ii (i.e., the signal is bi-directional or alternates between being an incoming and outgoing signal).

Whereas signal $S_{i,j}$ is always transported on the signal lead $SL_{i,j}$, signal $S_{i,j}$ might be, but is not necessarily, always transported on pad $P_{i,j}$. In accordance with the illustrative embodiment, transposing multiplexor 202 determines which signals are transported on which pads and when those signals are transported on those pads. In other words, for outgoing signals, transposing multiplexor 202 routes each outgoing signal from a signal lead to the appropriate pad, and for incoming signals, transposing multiplexor 202 routes each incoming signal from a pad to the appropriate signal lead. For this reason, transposing multiplexor 202 is said to "map" the array of signal leads to the array of pads. Transposing multiplexor 202 is described in detail below.

Figure 4:
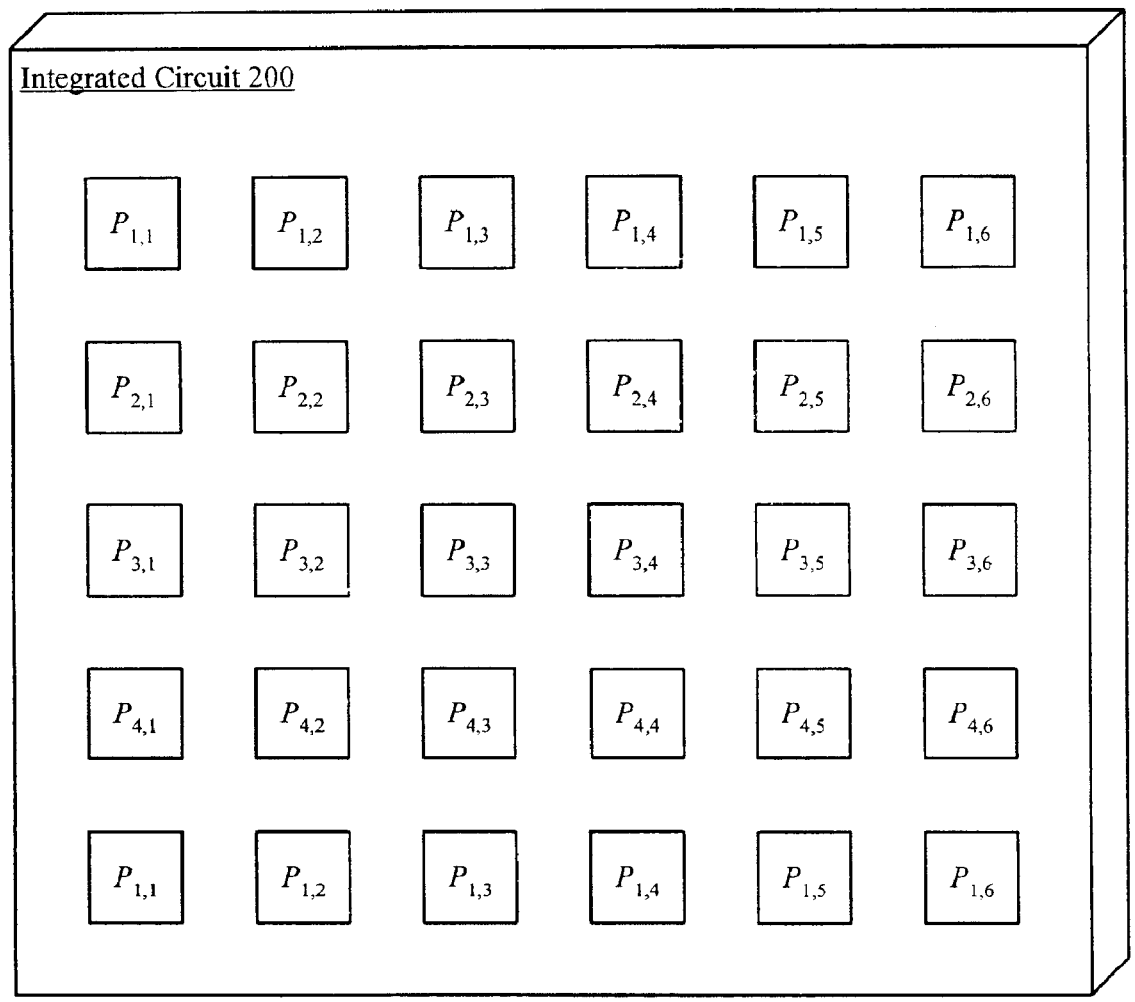
FIG. 4 depicts the array of pads associated with integrated circuit 200.

As depicted in FIG. 4, the array of pads is configured as a two-dimensional array and is intended to be surface mounted on a printed circuit board. After reading this specification, however, it will be clear to those skilled in the art how to make and use alternative embodiments of the present invention in which the array of pads have a different configuration (e.g., a dual in-line chip, etc.) or are mounted differently or are incorporated in a different package.

In accordance with the illustrative embodiment, integrated circuit 200 has a first or nominal transposition mode in which signal $S_{i,j}$ is transported on pad $P_{i,j}$. In other words, when integrated circuit 200 is in the first transposition mode, signal lead $SL_{i,j}$ is mapped to pad $P_{i,j}$.

For the purposes of this specification, the mapping of signal $SL_{i,j}$ to pad $P_{i,j}$ is represented by Equation 1.

$$P \leftrightharpoons SL \quad (Eq.\ 1)$$

wherein:

$$P = \begin{bmatrix} P_{1,1} & \cdots & P_{1,M} \\ \vdots & \ddots & \vdots \\ P_{N,1} & \cdots & P_{N,M} \end{bmatrix} = \begin{bmatrix} P_{1,1} & P_{1,2} & P_{1,3} & P_{1,4} & P_{1,5} & P_{1,6} \\ P_{2,1} & P_{2,2} & P_{2,3} & P_{2,4} & P_{2,5} & P_{2,6} \\ P_{3,1} & P_{3,2} & P_{3,3} & P_{3,4} & P_{3,5} & P_{3,6} \\ P_{4,1} & P_{4,2} & P_{4,3} & P_{4,4} & P_{4,5} & P_{4,6} \\ P_{5,1} & P_{5,2} & P_{5,3} & P_{5,4} & P_{5,5} & P_{5,6} \end{bmatrix} \quad (Eq.\ 2)$$

$$\text{and } SL = \begin{bmatrix} SL_{1,1} & \cdots & SL_{1,M} \\ \vdots & \ddots & \vdots \\ SL_{N,1} & \cdots & SL_{N,M} \end{bmatrix} = \begin{bmatrix} SL_{1,1} & SL_{1,2} & SL_{1,3} & SL_{1,4} & SL_{1,5} & SL_{1,6} \\ SL_{2,1} & SL_{2,2} & SL_{2,3} & SL_{2,4} & SL_{2,5} & SL_{2,6} \\ SL_{3,1} & SL_{3,2} & SL_{3,3} & SL_{3,4} & SL_{3,5} & SL_{3,6} \\ SL_{4,1} & SL_{4,2} & SL_{4,3} & SL_{4,4} & SL_{4,5} & SL_{4,6} \\ SL_{5,1} & SL_{5,2} & SL_{5,3} & SL_{5,4} & SL_{5,5} & SL_{5,6} \end{bmatrix} \quad (Eq.\ 3)$$

Equation 1 is, therefore, identical to:

$$\begin{bmatrix} P_{1,1} & P_{1,2} & P_{1,3} & P_{1,4} & P_{1,5} & P_{1,6} \\ P_{2,1} & P_{2,2} & P_{2,3} & P_{2,4} & P_{2,5} & P_{2,6} \\ P_{3,1} & P_{3,2} & P_{3,3} & P_{3,4} & P_{3,5} & P_{3,6} \\ P_{4,1} & P_{4,2} & P_{4,3} & P_{4,4} & P_{4,5} & P_{4,6} \\ P_{5,1} & P_{5,2} & P_{5,3} & P_{5,4} & P_{5,5} & P_{5,6} \end{bmatrix} \longleftrightarrow \begin{bmatrix} SL_{1,1} & SL_{1,2} & SL_{1,3} & SL_{1,4} & SL_{1,5} & SL_{1,6} \\ SL_{2,1} & SL_{2,2} & SL_{2,3} & SL_{2,4} & SL_{2,5} & SL_{2,6} \\ SL_{3,1} & SL_{3,2} & SL_{3,3} & SL_{3,4} & SL_{3,5} & SL_{3,6} \\ SL_{4,1} & SL_{4,2} & SL_{4,3} & SL_{4,4} & SL_{4,5} & SL_{4,6} \\ SL_{5,1} & SL_{5,2} & SL_{5,3} & SL_{5,4} & SL_{5,5} & SL_{5,6} \end{bmatrix} \quad (Eq.\ 1a)$$

Both equations 1 and 1a indicates that pad $P_{i,j}$ is mapped to signal lead $SL_{i,j}$ and this occurs when transposing multiplexor 202 is in the first transposition mode.

At task 303, transposing multiplexor 202 is designed. As described above, transposing multiplexor 202 acts like an NM by NM circuit switch and maps the array of signal leads to the array of pads pursuant to:

i. one or more control signals from payload logic 201 via lead 204, or
ii. one or more control signals from off of integrated circuit 200 that are received by transposing multiplexor 202 via one or more of the array of pads, or
iii. both i and ii.

The design of transposing multiplexor 202 is described in detail below and with respect to FIGS. 5 through 11.

At task 304, integrated circuit 200 is manufactured in well-known fashion and in accordance with how it was designed in tasks 301 through 303.

At task 305, integrated circuit 200 is operated and transposing multiplexor 202 maps the array of signal leads to the array of pads in the fashion in which it was designed. In particular, a control register in transposing multiplexor 202 (shown in FIG. 11) is loaded with control signals that indicate how it is to map the array of signal leads to the array of pads.

Figure 5:
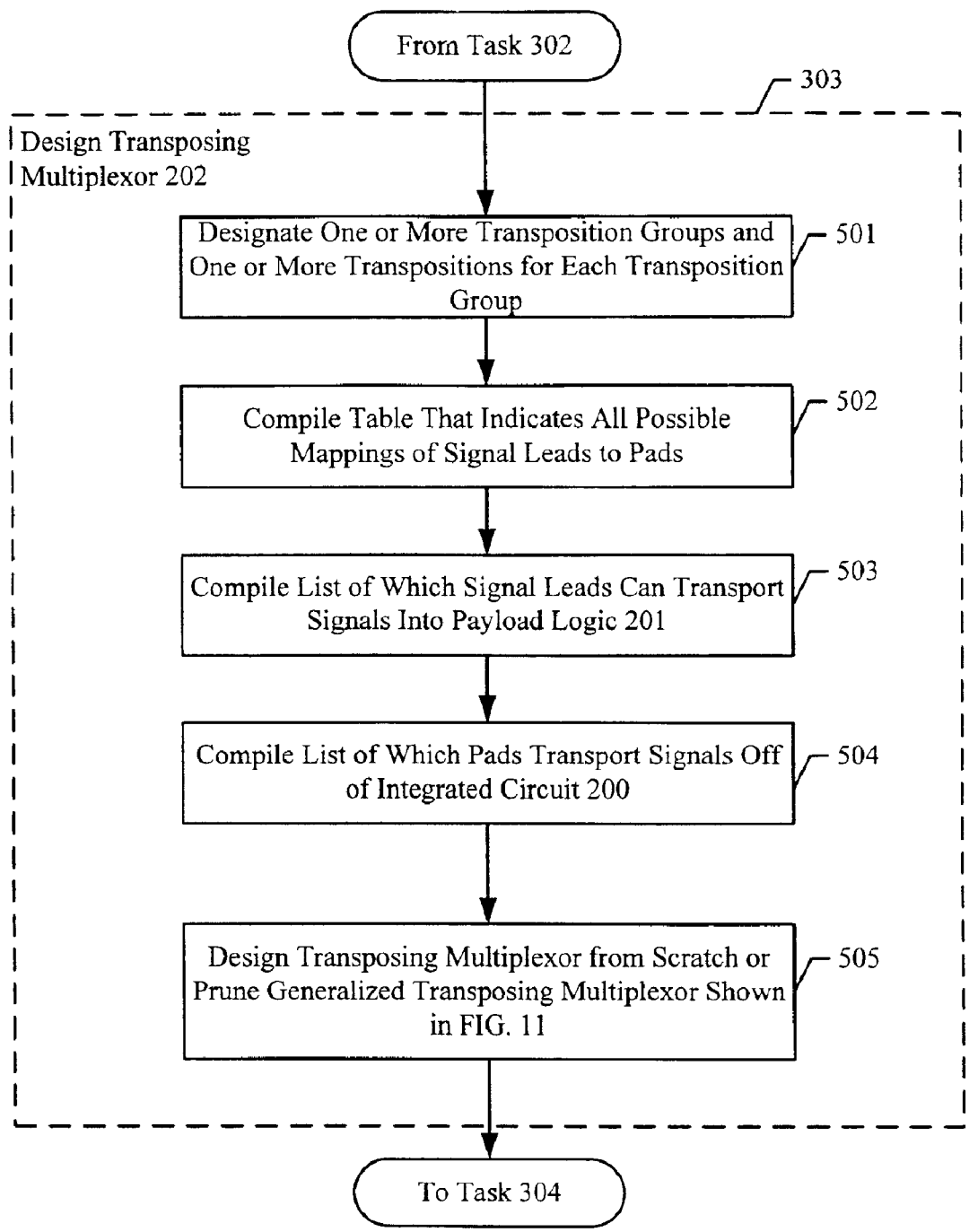
FIG. 5 depicts a flowchart of the subtasks composing the task of designing transposing multiplexor 202.

FIG. 5 depicts a flowchart of the subtasks composing the task of designing transposing multiplexor 202. For the purposes of this specification, a "transposing multiplexor" is defined as logic that enables the mapping of a plurality of signal leads and pads to be transposed around one or more transposition axes.

At subtask 501, one or more transposition groups are designated. For the purposes of this specification, a "transposition group" is defined as a plurality of signal leads and pads on an integrated circuit whose mapping can be modified by a transposing multiplexor.

In accordance with the illustrative embodiment, the mapping of the array signal leads to the array of pads is not fixed and unalterable at the time that the integrated circuit is designed or manufactured, but is reconfigurable:

i. in accordance with a default configuration, or
ii. when the integrated circuit is first powered up by signals coming from off of the integrated circuit, or
iii. during the operation of the integrated circuit by signals coming from off of the integrated circuit or from payload logic 201, or
iv. any combination of i, ii, and iii.

The pads on an integrated circuit are included in a transposition group when, for example, it might be necessary or advantageous to be able to transpose the mapping of signals to pads on that integrated circuit after the integrated circuit has been designed and manufactured. They can, for example, enable the layout of leads on printed circuit boards to be simplified and to have better electrical characteristics.

In accordance with the illustrative embodiment, integrated circuit 200 comprises four transposition groups: Transposition Group A, Transposition Group B, Transposition Group C, and Transposition Group D. After reading this specification, it will be clear to those skilled in the art how to make and use alternative embodiments of the present invention that have any number of transposition groups.

The rules for designating and operating transposition groups are as follows:

1) An integrated circuit can comprise one or more transposition groups.
2) A transposition group can comprise one or more other transposition groups.
3) A transposition group can overlap one or more other transposition groups.
4) A transposition group can be mutually exclusive of one or more other transposition groups.
5) A transposition group comprises one or more pads on an integrated circuit.
   a) If a transposition group comprises pad $P_{i,j}$, then the group also comprises signal lead $SL_{i,j}$.
   b) If a transposition group comprises signal lead $SL_{i,j}$, then the group also comprises pad $P_{i,j}$.
6) The pads in one transposition group need not be contiguous.
7) A transposition group can comprise a one-dimensional vector of pads or a two-dimensional array of pads.
8) A one-dimensional transposition group can be transposed around one transposition axis.
9) A non-square two-dimensional group can be transposed around two transposition axes.
10) A square two-dimensional group can be transposed around four transposition axes.
11) A transposition group can be transposed independently or in combination with one or more other transposition groups.
12) A transposition can be performed independently or in combination with one or more other transpositions.
13) $T_{IND}$ is the identity transposition, which is represented by the N-by-M identity transposition matrix shown in Equation 5:

$$T_{IND} = \begin{bmatrix} 0 & 0 & 0 & 0 & 0 & 0 \\ 0 & 0 & 0 & 0 & 0 & 0 \\ 0 & 0 & 0 & 0 & 0 & 0 \\ 0 & 0 & 0 & 0 & 0 & 0 \\ 0 & 0 & 0 & 0 & 0 & 0 \end{bmatrix} \quad \text{(Eq. 5)}$$

such that $$S = S \circ T_{IND} \quad \text{(Eq. 6)}$$

a) A "0" in position i,j in a transposition matrix indicates that pad $P_{i,j}$ is mapped to signal lead $SL_{i,j}$ in accordance with that transposition. It is for this reason that the identity transposition matrix $T_{IND}$ is fully populated with zeroes.

14) The transposition operator "o" indicates how one or more transpositions affect the mapping of the array of pads to the array of signal leads.

15) The transposition operator "o" is commutative. In other words:

$$T_{A1} \circ S = S \circ T_{A1} \quad \text{(Eq. 7)}$$

16) The transposition operator "o" is associative. In other words:

$$(S \circ T_{A1}) \circ T_{A2} = S \circ (T_{A1} \circ T_{A2}) \quad \text{(Eq. 8)}$$

17) Each transposition is involutory. In other words, a two-fold operation of an involutory transposition cancels itself. In other words:

$$T_{A1} \circ T_{A1} = T_{IND} \quad \text{(Eq. 9)}$$

For the purposes of this specification, the function f(x) is defined to be involutory if, and only if f(f(x))=x.

Figure 6:
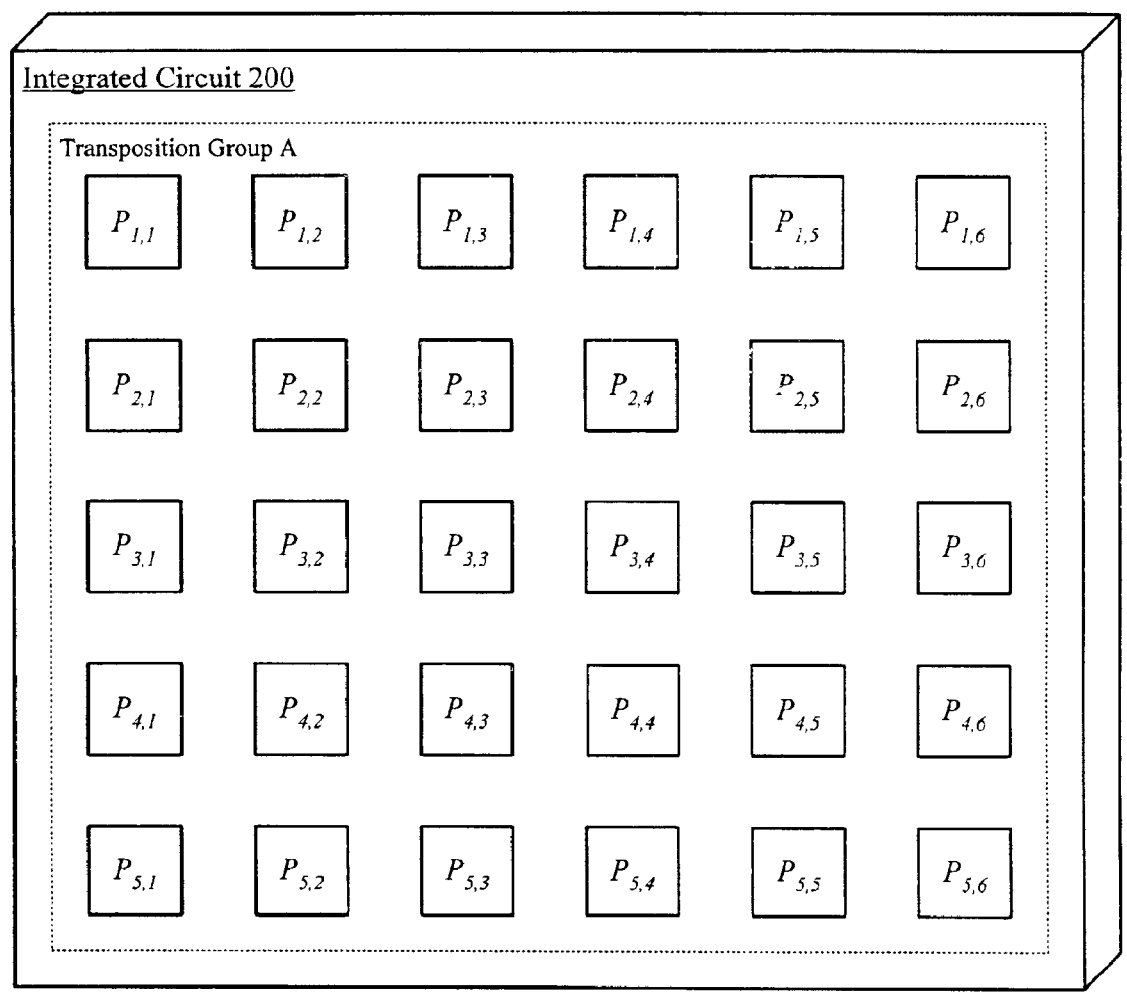
FIG. 6 depicts the first transposition group, Transposition Group A for integrated circuit 200.

In accordance with the illustrative embodiment, the first transposition group, Transposition Group A comprises all of the pads in the array of pads, as shown in FIG. 6. After reading this specification, however, it will be clear to those skilled in the art how and when to make alternative embodiments of the present invention in which no transposition group comprises all of the pads in the array of pads.

Figure 7:
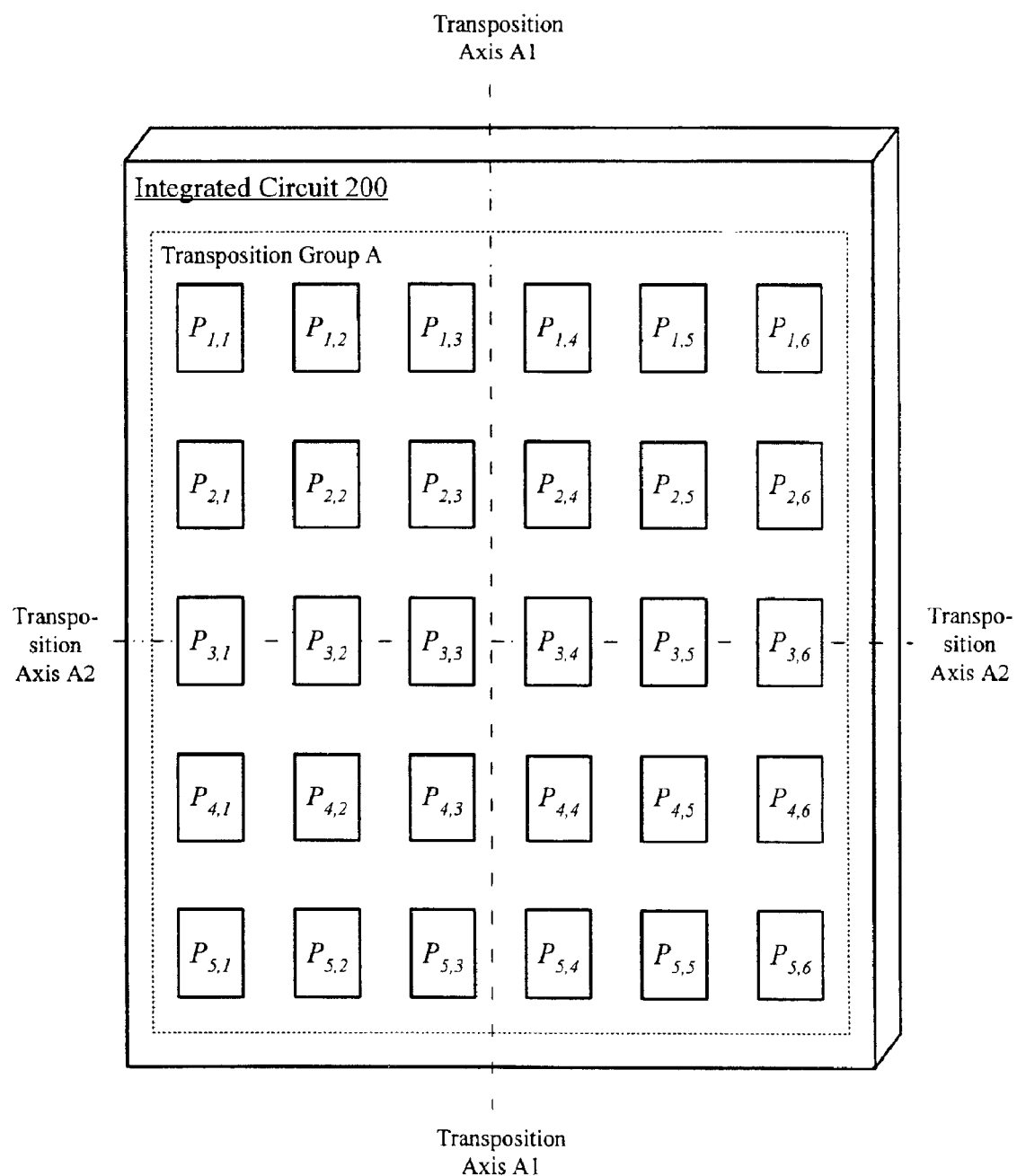
FIG. 7 depicts the two transposition axes, Transposition Axis A1 and Transposition Axis A2, associated with Transposition Group A.

Transposition Group A is a non-square two-dimensional array of pads. Because Transposition Group A is a non-square two-dimensional array of pads, it can be transposed around two transposition axes only, Transposition Axis A1 and Transposition Axis A2, as depicted in FIG. 7.

A mapping of the array of pads to the array of signal leads as transposed only by Transposition A1 is represented by:

$$P \leftrightarrows S \circ T_{A1} \quad \text{(Eq. 10)}$$

wherein $T_{A1}$ represents the transposition matrix A1, which unambiguously defines a mapping of the array of pads to the array of signal leads. The transposition matrix A1 is defined as:

$$T_{A1} = \begin{bmatrix} T_{1,6} & T_{1,5} & T_{1,4} & T_{1,3} & T_{1,2} & T_{1,1} \\ T_{2,6} & T_{2,5} & T_{2,4} & T_{2,3} & T_{2,2} & T_{2,1} \\ T_{3,6} & T_{3,5} & T_{3,4} & T_{3,3} & T_{3,2} & T_{3,1} \\ T_{4,6} & T_{4,5} & T_{4,4} & T_{4,3} & T_{4,2} & T_{4,1} \\ T_{5,6} & T_{5,5} & T_{5,4} & T_{5,3} & T_{5,2} & T_{5,1} \end{bmatrix} \quad \text{(Eq. 11)}$$

Equation 10 is equivalent to:

$$\begin{bmatrix} P_{1,1} & P_{1,2} & P_{1,3} & P_{1,4} & P_{1,5} & P_{1,6} \\ P_{2,1} & P_{2,2} & P_{2,3} & P_{2,4} & P_{2,5} & P_{2,6} \\ P_{3,1} & P_{3,2} & P_{3,3} & P_{3,4} & P_{3,5} & P_{3,6} \\ P_{4,1} & P_{4,2} & P_{4,3} & P_{4,4} & P_{4,5} & P_{4,6} \\ P_{5,1} & P_{5,2} & P_{5,3} & P_{5,4} & P_{5,5} & P_{5,6} \end{bmatrix} \longleftrightarrow \begin{bmatrix} S_{1,6} & S_{1,5} & S_{1,4} & S_{1,3} & S_{1,2} & S_{1,1} \\ S_{2,6} & S_{2,5} & S_{2,4} & S_{2,3} & S_{2,2} & S_{2,1} \\ S_{3,6} & S_{3,5} & S_{3,4} & S_{3,3} & S_{3,2} & S_{3,1} \\ S_{4,6} & S_{4,5} & S_{4,4} & S_{4,3} & S_{4,2} & S_{4,1} \\ S_{5,6} & S_{5,5} & S_{5,4} & S_{5,3} & S_{5,2} & S_{5,1} \end{bmatrix} \quad \text{(Eq. 12)}$$

In other words, Equation 12 indicates that pad $P_{i,j}$ is mapped to signal lead $SL_{i,(M-j+1)}$ when transposition multiplexor 202 invokes only Transposition A1.

A mapping of the array of pads to the array of signal leads as transposed only by Transposition A2 is represented by:

$$P \leftrightarrows S \circ T_{A2} \quad \text{(Eq. 13)}$$

wherein $T_{A2}$ represents the transposition matrix A2, which unambiguously defines a mapping of the array of pads to the array of signal leads. The transposition matrix A2 is defined as:

$$T_{A2} = \begin{bmatrix} T_{5,1} & T_{5,2} & T_{5,3} & T_{5,4} & T_{5,5} & T_{5,6} \\ T_{4,1} & T_{4,2} & T_{4,3} & T_{4,4} & T_{4,5} & T_{4,6} \\ 0 & 0 & 0 & 0 & 0 & 0 \\ T_{2,1} & T_{2,2} & T_{2,3} & T_{2,4} & T_{2,5} & T_{2,6} \\ T_{1,1} & T_{1,2} & T_{1,3} & T_{1,4} & T_{1,5} & T_{1,6} \end{bmatrix} \quad \text{(Eq. 14)}$$

Equation 13 is equivalent to:

$$\begin{bmatrix} P_{1,1} & P_{1,2} & P_{1,3} & P_{1,4} & P_{1,5} & P_{1,6} \\ P_{2,1} & P_{2,2} & P_{2,3} & P_{2,4} & P_{2,5} & P_{2,6} \\ P_{3,1} & P_{3,2} & P_{3,3} & P_{3,4} & P_{3,5} & P_{3,6} \\ P_{4,1} & P_{4,2} & P_{4,3} & P_{4,4} & P_{4,5} & P_{4,6} \\ P_{5,1} & P_{5,2} & P_{5,3} & P_{5,4} & P_{5,5} & P_{5,6} \end{bmatrix} \longleftrightarrow \begin{bmatrix} S_{5,1} & S_{5,2} & S_{5,3} & S_{5,4} & S_{5,5} & S_{5,6} \\ S_{4,1} & S_{4,2} & S_{4,3} & S_{4,4} & S_{4,5} & S_{4,6} \\ S_{3,1} & S_{3,2} & S_{3,3} & S_{3,4} & S_{3,5} & S_{3,6} \\ S_{2,1} & S_{2,2} & S_{2,3} & S_{2,4} & S_{2,5} & S_{2,6} \\ S_{1,1} & S_{1,2} & S_{1,3} & S_{1,4} & S_{1,5} & S_{1,6} \end{bmatrix} \quad \text{(Eq. 15)}$$

In other words, Equation 15 indicates that pad $P_{i,j}$ is mapped to signal lead $SL_{(N-i+1),j}$ when transposition multiplexor 202 invokes only Transposition A2. Note that in accordance with Transposition A2, the middle row is not transposed because there was an odd number of rows in the array of pads and the array of signal leads.

A mapping of the array of pads to the array of signal leads as transposed by both Transposition A1 and Transposition A2 is represented by:

$$P \leftrightarrows S \circ T_{A1} \circ T_{A2} \quad \text{(Eq. 16)}$$

which is equivalent to:

$$\begin{bmatrix} P_{1,1} & P_{1,2} & P_{1,3} & P_{1,4} & P_{1,5} & P_{1,6} \\ P_{2,1} & P_{2,2} & P_{2,3} & P_{2,4} & P_{2,5} & P_{2,6} \\ P_{3,1} & P_{3,2} & P_{3,3} & P_{3,4} & P_{3,5} & P_{3,6} \\ P_{4,1} & P_{4,2} & P_{4,3} & P_{4,4} & P_{4,5} & P_{4,6} \\ P_{5,1} & P_{5,2} & P_{5,3} & P_{5,4} & P_{5,5} & P_{5,6} \end{bmatrix} \longleftrightarrow \begin{bmatrix} S_{5,6} & S_{5,5} & S_{5,4} & S_{5,3} & S_{5,2} & S_{5,1} \\ S_{4,6} & S_{4,5} & S_{4,4} & S_{4,3} & S_{4,2} & S_{4,1} \\ S_{3,6} & S_{3,5} & S_{3,4} & S_{3,3} & S_{3,2} & S_{3,1} \\ S_{2,6} & S_{2,5} & S_{2,4} & S_{2,3} & S_{2,2} & S_{2,1} \\ S_{1,6} & S_{1,5} & S_{1,4} & S_{1,3} & S_{1,2} & S_{1,1} \end{bmatrix} \quad \text{(Eq. 17)}$$

In other words, Equation 17 indicates that pad $P_{i,j}$ is mapped to signal lead $SL_{(N-i+1),(M-j+1)}$ when transposition multiplexor 202 invokes both Transposition A1 and Transposition A2.

Figure 8:
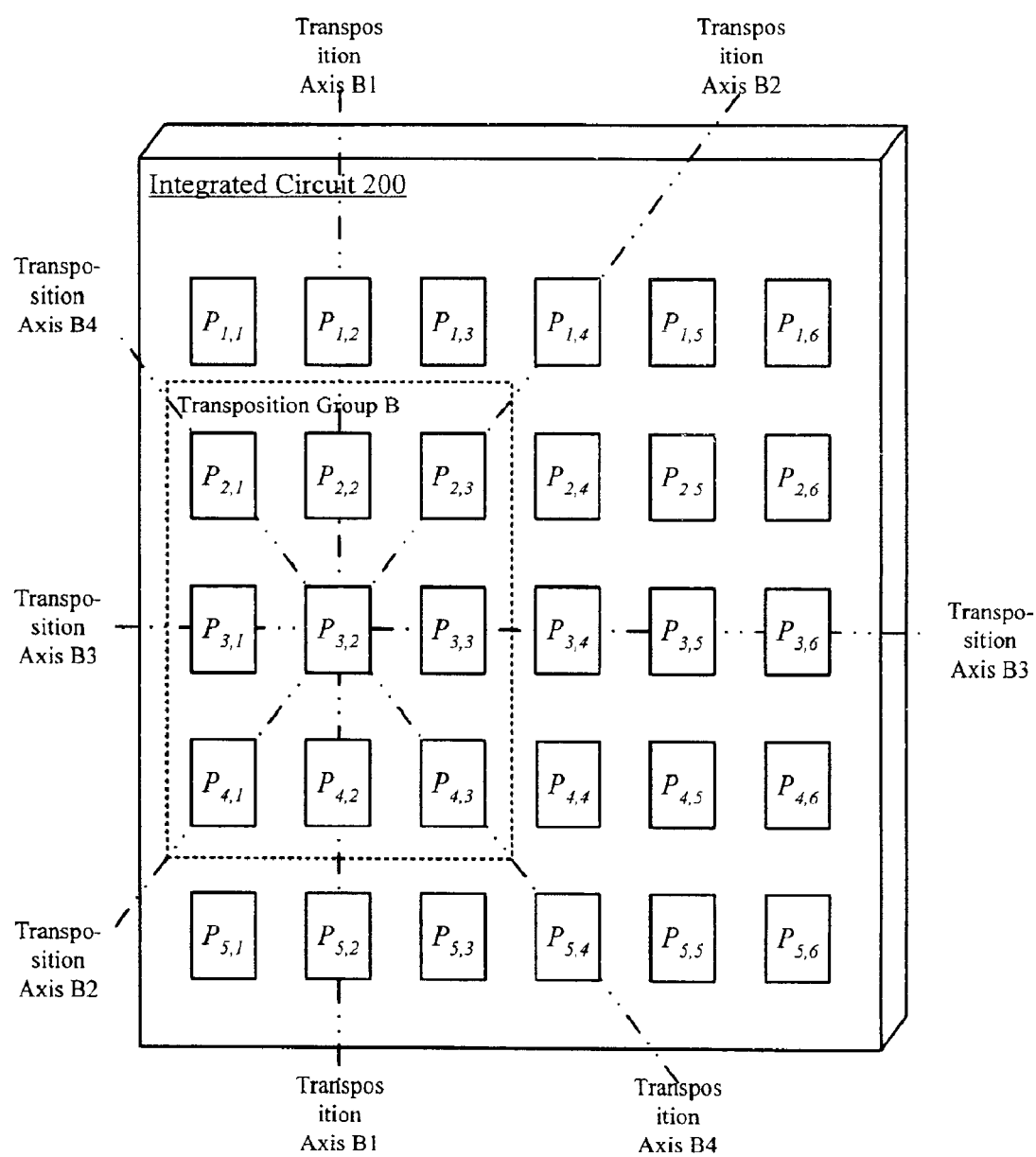
FIG. 8 depicts the second transposition group, Transposition Group B for integrated circuit 200 and the four transposition axes, Transposition Axis B1, Transposition Axis B2, Transposition Axis B3, and Transposition Axis B4 associated with Transposition Group B.

In accordance with the illustrative embodiment, the second transposition group, Transposition Group B comprises a non-empty proper subset of the pads in the array of pads, as shown in FIG. 8.

Transposition Group B is a square two-dimensional array of pads. Because Transposition Group B is a square two-dimensional array of pads, it can be transposed around four transposition axes, Transposition Axis B1, Transposition Axis B2, Transposition Axis B3, and Transposition Axis B4, as depicted in FIG. 8.

A mapping of the array of pads to the array of signal leads as transposed only by Transposition B1 is represented by:

$$P \leftrightarrows S \circ T_{B1} \quad \text{(Eq. 18)}$$

wherein $T_{B1}$ represents the transposition matrix B1, which unambiguously defines a mapping of the array of pads to the array of signal leads. The transposition matrix B1 is defined as:

$$T_{B1} = \begin{bmatrix} 0 & 0 & 0 & 0 & 0 & 0 \\ T_{2,3} & 0 & T_{2,1} & 0 & 0 & 0 \\ T_{3,3} & 0 & T_{3,1} & 0 & 0 & 0 \\ T_{4,3} & 0 & T_{4,1} & 0 & 0 & 0 \\ 0 & 0 & 0 & 0 & 0 & 0 \end{bmatrix} \quad \text{(Eq. 19)}$$

Equation 18 is equivalent to:

$$\begin{bmatrix} P_{1,1} & P_{1,2} & P_{1,3} & P_{1,4} & P_{1,5} & P_{1,6} \\ P_{2,1} & P_{2,2} & P_{2,3} & P_{2,4} & P_{2,5} & P_{2,6} \\ P_{3,1} & P_{3,2} & P_{3,3} & P_{3,4} & P_{3,5} & P_{3,6} \\ P_{4,1} & P_{4,2} & P_{4,3} & P_{4,4} & P_{4,5} & P_{4,6} \\ P_{5,1} & P_{5,2} & P_{5,3} & P_{5,4} & P_{5,5} & P_{5,6} \end{bmatrix} \longleftrightarrow \begin{bmatrix} S_{1,1} & S_{1,2} & S_{1,3} & S_{1,4} & S_{1,5} & S_{1,6} \\ S_{2,3} & S_{2,2} & S_{2,1} & S_{2,4} & S_{2,5} & S_{2,6} \\ S_{3,3} & S_{3,2} & S_{3,1} & S_{3,4} & S_{3,5} & S_{3,6} \\ S_{4,3} & S_{4,2} & S_{4,1} & S_{4,4} & S_{4,5} & S_{4,6} \\ S_{5,1} & S_{5,2} & S_{5,3} & S_{5,4} & S_{5,5} & S_{5,6} \end{bmatrix} \quad \text{(Eq. 20)}$$

In other words, Equation 20 indicates that in accordance with transposition B1, only six pads and signal leads have been remapped in contrast to the first transposition mode.

A mapping of the array of pads to the array of signal leads as transposed only by Transposition B2 is represented by:

$$P \leftrightharpoons S \circ T_{B2} \quad \text{(Eq. 21)}$$

wherein $T_{B2}$ represents the transposition matrix B2, which unambiguously defines a mapping of the array of pads to the array of signal leads. Transposition matrix B2 is defined as:

$$T_{B2} = \begin{bmatrix} 0 & 0 & 0 & 0 & 0 & 0 \\ T_{4,3} & T_{3,3} & 0 & 0 & 0 & 0 \\ T_{4,2} & 0 & T_{2,2} & 0 & 0 & 0 \\ 0 & T_{3,1} & T_{2,1} & 0 & 0 & 0 \\ 0 & 0 & 0 & 0 & 0 & 0 \end{bmatrix} \quad \text{(Eq. 22)}$$

Equation 21 is equilvalent to:

$$\begin{bmatrix} P_{1,1} & P_{1,2} & P_{1,3} & P_{1,4} & P_{1,5} & P_{1,6} \\ P_{2,1} & P_{2,2} & P_{2,3} & P_{2,4} & P_{2,5} & P_{2,6} \\ P_{3,1} & P_{3,2} & P_{3,3} & P_{3,4} & P_{3,5} & P_{3,6} \\ P_{4,1} & P_{4,2} & P_{4,3} & P_{4,4} & P_{4,5} & P_{4,6} \\ P_{5,1} & P_{5,2} & P_{5,3} & P_{5,4} & P_{5,5} & P_{5,6} \end{bmatrix} \longleftrightarrow \begin{bmatrix} S_{1,1} & S_{1,2} & S_{1,3} & S_{1,4} & S_{1,5} & S_{1,6} \\ S_{4,3} & S_{3,3} & S_{2,3} & S_{2,4} & S_{2,5} & S_{2,6} \\ S_{4,2} & S_{3,2} & S_{2,2} & S_{3,4} & S_{3,5} & S_{3,6} \\ S_{4,1} & S_{3,1} & S_{2,1} & S_{4,4} & S_{4,5} & S_{4,6} \\ S_{5,1} & S_{5,2} & S_{5,3} & S_{5,4} & S_{5,5} & S_{5,6} \end{bmatrix} \quad \text{(Eq. 23)}$$

In other words, Equation 26 indicates that in accordance with transposition B2, only six pads and signal leads have been remapped in contrast to the first transposition mode.

Transposition matrix B3 is defined as:

$$T_{B3} = \begin{bmatrix} 0 & 0 & 0 & 0 & 0 & 0 \\ T_{4,1} & T_{4,2} & T_{4,3} & 0 & 0 & 0 \\ 0 & 0 & 0 & 0 & 0 & 0 \\ T_{2,1} & T_{2,2} & T_{2,3} & 0 & 0 & 0 \\ 0 & 0 & 0 & 0 & 0 & 0 \end{bmatrix} \quad \text{(Eq. 22)}$$

and, analogously, transpostion matrix B4 is defined as:

$$T_{B2} = \begin{bmatrix} 0 & 0 & 0 & 0 & 0 & 0 \\ 0 & T_{3,1} & T_{4,1} & 0 & 0 & 0 \\ T_{2,2} & 0 & T_{4,2} & 0 & 0 & 0 \\ T_{2,3} & T_{3,3} & 0 & 0 & 0 & 0 \\ 0 & 0 & 0 & 0 & 0 & 0 \end{bmatrix} \quad \text{(Eq. 22)}$$

The third transposition group in the illustrative embodiment is transposition group C. Transpostion Group C comprises a one-dimensional vector of pads, as shown in FIG. 9.

Transposition Group C is a non-empty proper subset of both Transposition Group A and Transposition Group B.

Figure 9:
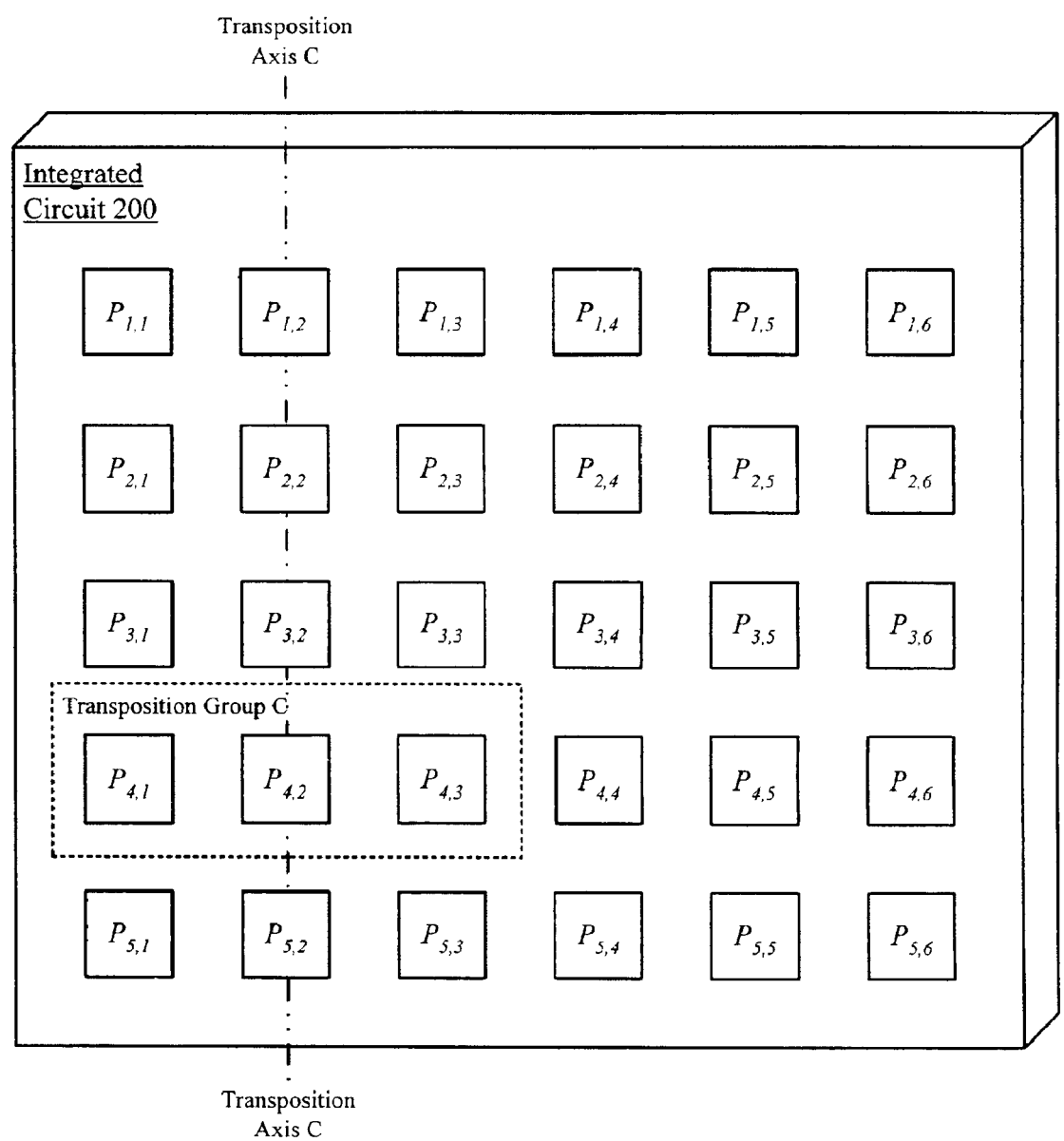
FIG. 9 depicts the third transposition group, Transposition Group C, for integrated circuit 200 and the one transposition axis, Transposition Axis C, associated with Transposition Group C.

Because Transposition Group C is a one-dimensional vector of pads, it can be transposed around only one transposition Axis C, as depicted in FIG. 9.

A mapping of the array of pads to the array of signal leads as transposed only by Transposition C is represented by:

$$P \leftrightharpoons S \circ T_C \quad \text{(Eq. 18)}$$

wherein $T_C$ represents the Transposition Matrix C, which unambiguously defines a mapping of two pads to two signal leads. The transposition matrix C is defined as:

(Eq. 23)

$$T_C = \begin{bmatrix} 0 & 0 & 0 & 0 & 0 & 0 \\ 0 & 0 & 0 & 0 & 0 & 0 \\ 0 & 0 & 0 & 0 & 0 & 0 \\ T_{4,3} & 0 & T_{4,1} & 0 & 0 & 0 \\ 0 & 0 & 0 & 0 & 0 & 0 \end{bmatrix} \quad \text{(Eq. 19)}$$

Figure 10:
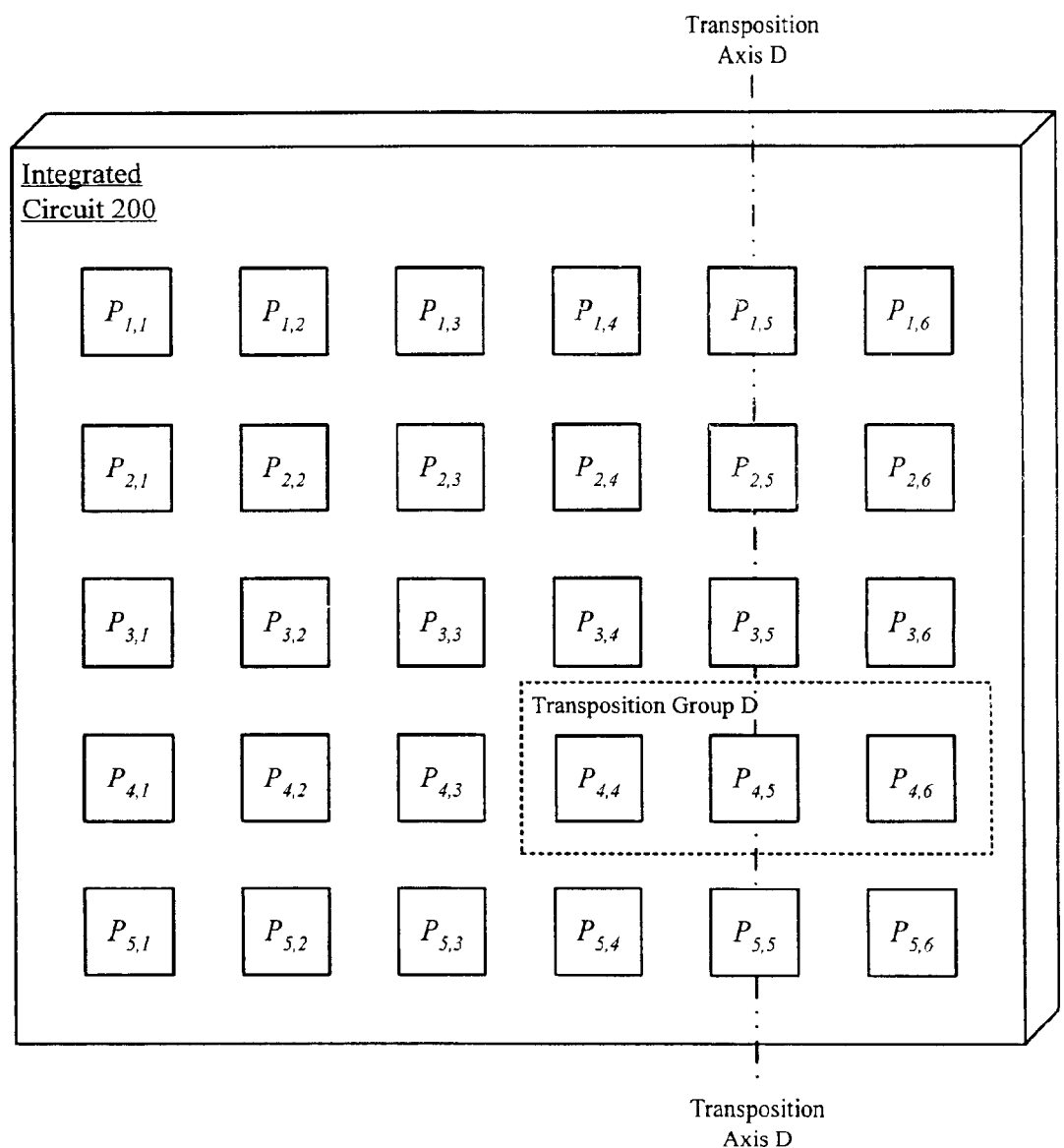
FIG. 10 depicts the fourth transposition group, Transposition Group D, for integrated circuit 200 and the one transposition axis, Transposition Axis D, associated with Transposition Group D.

The fourth and final transposition group in the illustrative embodiment is Transposition Group D. Transposition Group D is also one-dimensional vector of pads, as shown in FIG. 10, and is a non-empty proper subset of Transposition Group A. Transposition Group D is mutually exclusive to both Transposition Group B and Transposition Group C.

Because Transposition Group D is a one-dimensional vector of pads, it can be transposed around only one transposition axis, Transposition Axis D, which is also depicted in FIG. 10.

A mapping of the array of pads to the array of signal leads as transposed only by Transposition D is represented by:

$$P \leftrightharpoons S \circ T_D \quad \text{(Eq. 18)}$$

wherein $T_D$ represents the Transposition Matrix D, which unambiguously defines a mapping of the array of pads to the array of signal leads. The Transposition Matrix D is defined as:

$$T_D = \begin{bmatrix} 0 & 0 & 0 & 0 & 0 & 0 \\ 0 & 0 & 0 & 0 & 0 & 0 \\ 0 & 0 & 0 & 0 & 0 & 0 \\ 0 & 0 & 0 & T_{4,6} & 0 & T_{4,4} \\ 0 & 0 & 0 & 0 & 0 & 0 \end{bmatrix} \quad \text{(Eq. 19)}$$

Any combination of the transpositions designated above can be invoked by transposing multiplexor 202. For example, a mapping of the array of pads to the array of signal leads as transposed by Transposition A1, Transposition C, and Transposition D is represented by:

$$P \leftrightarrows S \circ T_{A1} \circ T_C \circ T_D \quad \text{(Eq. 18)}$$

which is equivalent to:

$$\begin{bmatrix} P_{1,1} & P_{1,2} & P_{1,3} & P_{1,4} & P_{1,5} & P_{1,6} \\ P_{2,1} & P_{2,2} & P_{2,3} & P_{2,4} & P_{2,5} & P_{2,6} \\ P_{3,1} & P_{3,2} & P_{3,3} & P_{3,4} & P_{3,5} & P_{3,6} \\ P_{4,1} & P_{4,2} & P_{4,3} & P_{4,4} & P_{4,5} & P_{4,6} \\ P_{5,1} & P_{5,2} & P_{5,3} & P_{5,4} & P_{5,5} & P_{5,6} \end{bmatrix} \leftrightarrow \begin{bmatrix} S_{1,6} & S_{1,5} & S_{1,4} & S_{1,3} & S_{1,2} & S_{1,1} \\ S_{2,6} & S_{2,5} & S_{2,4} & S_{2,3} & S_{2,2} & S_{2,1} \\ S_{3,6} & S_{3,5} & S_{3,4} & S_{3,3} & S_{3,2} & S_{3,1} \\ S_{4,4} & S_{4,5} & S_{4,6} & S_{4,1} & S_{4,2} & S_{4,3} \\ S_{5,6} & S_{5,5} & S_{5,4} & S_{5,3} & S_{5,2} & S_{5,1} \end{bmatrix} \quad \text{(Eq. 12)}$$

After reading this specification, it will be clear to those skilled in the art how to determine which combinations of transpositions to invoke in any given circumstance.

At subtask 502, a table is made that indicates which pads can be mapped to which signal leads in all combinations of the transpositions designated in subtask 501. For example, Table 1 lists which signal leads pad $P_{1,1}$ can be mapped to.

TABLE 1

Possible Mappings of Pad $P_{1,1}$

| Signal Lead | Transposition | | | | | | | |
| --- | --- | --- | --- | --- | --- | --- | --- | --- |
| | A1 | A2 | B1 | B2 | B3 | B4 | C | D |
| $SL_{1,1}$ | No | No | x | x | x | x | x | x |
| $SL_{5,1}$ | No | Yes | x | x | x | x | x | x |
| $SL_{1,6}$ | Yes | No | x | x | x | x | x | x |
| $SL_{5,6}$ | Yes | Yes | x | x | x | x | x | x |

Table 1 indicates that pad $P_{1,1}$ is mapped to signal lead $SL_{1,1}$ when and only when neither transposition A1 nor transposition A2 is invoked and regardless of whether transposition B1, B2, B3, B4, C, or D is invoked (an "x" represents a don't care). Analogously, Table 1 indicates that pad $P_{1,1}$ is mapped to signal lead $SL_{5,1}$ when and only when transposition A2 is invoked and transposition A1 is not invoked and regardless of whether transposition B1, B2, B3, B4, C, or D is invoked. Table 1 indicates that pad $P_{1,1}$ is mapped to signal lead $SL_{1,6}$ when and only when transposition A1 is invoked and transposition A2 is not invoked and regardless of whether transposition B1, B2, B3, B4, C, or D is invoked. Table 1 indicates that pad $P_{1,1}$ is mapped to signal lead $SL_{5,6}$ when both transposition A1 and transposition A2 are invoked. It will be clear to those skilled in the art how to make a table that indicates which pads can be mapped to which signal leads in all combinations and transpositions designated in subtask 501.

At subtask 503, a list is made of which signal leads can transport signals into payload logic 201 from off of integrated circuit 200 in accordance with any combination of the transpositions designated in subtask 501. It will be clear to those skilled in the art how to compile this list.

At subtask 504, a list is made of which pads can transport signals off of integrated circuit 200 in accordance with any combination of the transpositions designated in subtask 502. It will be clear to those skilled in the art how to compile this list.

Figure 11:
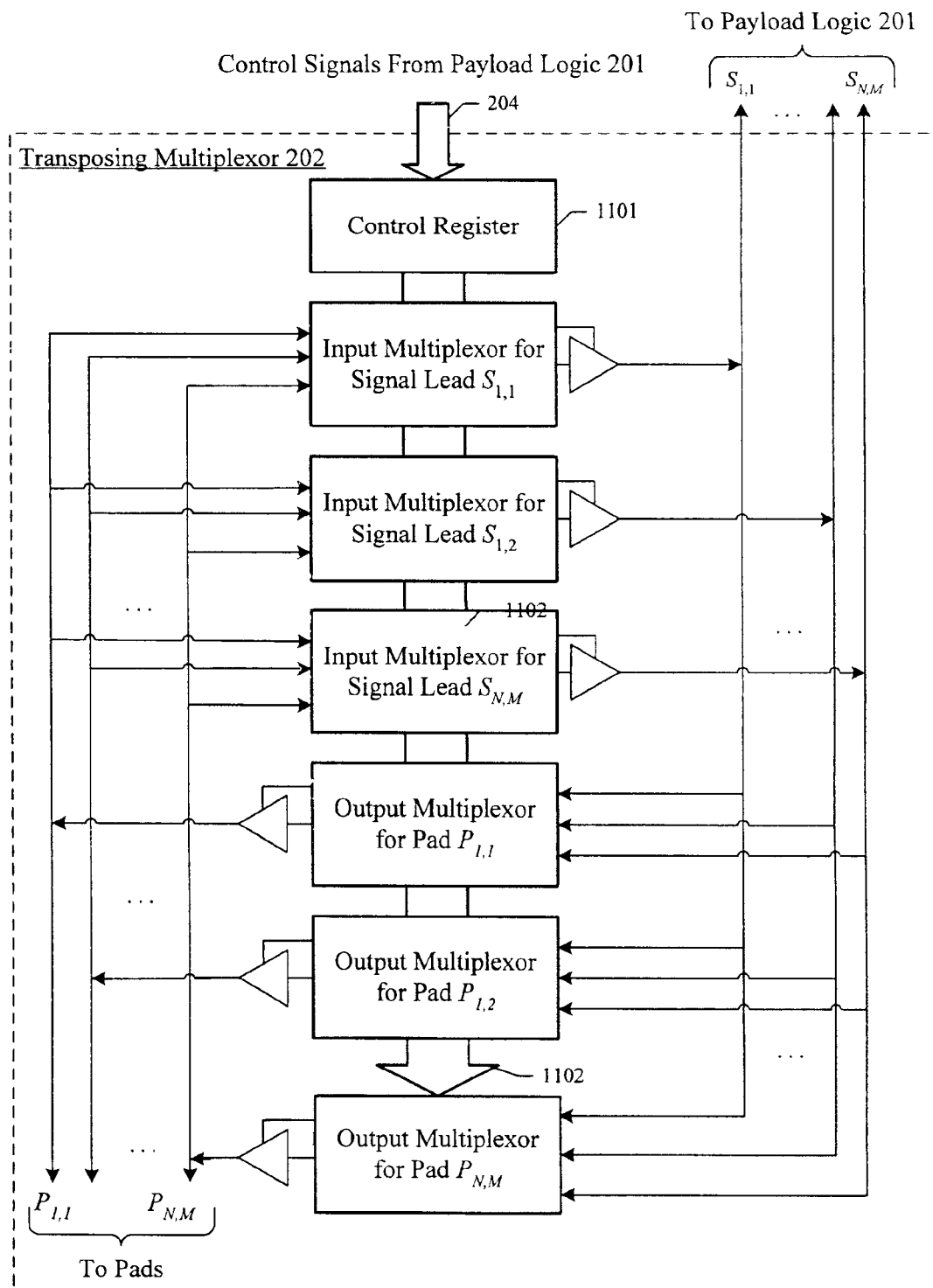
FIG. 11 depicts a block diagram of generalized transposing multiplexor 202, which is capable of mapping any pad to any signal lead in any combination of transpositions.

At subtask 505, transposing multiplexor 202 is designed to accommodate the mappings compiled in subtasks 502 and the lists compiled in subtasks 503 and 504. It will be clear to those skilled in the art how to design transposing multiplexor 202 from scratch using combinatorial logic and tri-state gates. For example, FIG. 11 depicts a block diagram of the salient components of a generalized transposing multiplexor 202, which is capable of mapping any pad to any signal lead in any combination of transpositions. It will be clear to those skilled in the art how to prune or trim the generalized transposing multiplexor 202 depicted in FIG. 11 in light of the mappings compiled in subtasks 502 and the lists compiled in subtasks 503 and 504.

For example, when the table compiled in subtask 502 indicates that there is only one possible mapping between a signal lead and a pad, the input multiplexor for that signal lead and the output multiplexor for that pad can be eliminated and a direct connection made between the signal lead and the pad.

Furthermore, when the list compiled in subtask 503 indicates that a signal lead cannot transport a signal into payload logic 201, then the input multiplexor for that signal lead can be eliminated. Analogously, when the list compiled in subtask 504 indicates that a pad cannot transport a signal off of integrated circuit 200, then the output multiplexor for that pad can be eliminated.

And finally, when the table compiled in subtask 502 indicates that a signal lead can—in any combination of transpositions—transport a signal to a pad, then that signal lead must be fed into the output multiplexor for that pad. Analogously, when the table compiled in subtask 502 indicates that a pad can—in any combination of transpositions—transport a signal into payload logic 201, then that input pad must be fed into the input multiplexor associated with the signal lead for that signal.

Each input multiplexor has a tri-state gate on its output when its associated signal lead can carry a signal both into and out of payload logic 201. Furthermore, a tri-state gate is not necessary on an input multiplexor when its associated signal lead can only carry a signal into payload logic 201.

Analogously, each output multiplexor has a tri-state gate on its output when its associated pad can carry a signal both onto and off of integrated circuit 200. Furthermore, a tri-state gate is not necessary on an output multiplexor when its associated pad can only carry a signal off of integrated circuit 200.

Control register 1101 is a register that contains one bit for each possible transposition. For example, Table 2 depicts control register 1101 in accordance with the illustrative embodiment of the present invention and it contains one bit for each of the eight possible transpositions designated in subtask 501 above.

TABLE 2

Control Register 1101 in Accordance with Illustrative Embodiment
Transposition

| A1 | A2 | B1 | B2 | B3 | B4 | C | D |
| --- | --- | --- | --- | --- | --- | --- | --- |

Each bit in control register 1101 indicates whether transposition multiplexor 201 should invoke that transposition or not. For example, Table 3 depicts control register 1101 in which only transpositions A1, C, and D are to be invoked.

TABLE 3

Control Register 1101 in Accordance with Illustrative Embodiment
Transposition

| A1 | A2 | B1 | B2 | B3 | B4 | C | D |
| --- | --- | --- | --- | --- | --- | --- | --- |
| 1 | 0 | 0 | 0 | 0 | 0 | 1 | 1 |

The state of control register 1101 is conveyed to each of the input multiplexors and output multiplexors via bus 1102, which is depicted in FIG. 11.

After reading this specification, however, it will be clear to those skilled in the art how to make and use transposition multiplexor 202 in accordance with another design.

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

What is claimed is:

1. An integrated circuit comprising:
   a first signal lead;
   a second signal lead;
   a first pad electrically connected to said first signal lead when said integrated circuit is in a first transposition mode and electrically connected to said second signal lead when said integrated circuit is in a second transposition mode;
   a second pad electrically connected to said second signal lead when said integrated circuit is in said first transposition mode and electrically connected to said first signal lead when said integrated circuit is in said second transposition mode; and
   a transposing multiplexor for electrically connecting said first signal lead to said first pad and said second signal lead to said second pad when said integrated circuit is in said first transposition mode and for electrically connecting said first signal lead to said second pad and said second signal lead to said first pad when said integrated circuit is in said second transposition mode.

2. An integrated circuit comprising:
   an array of pads, $P_{N,M}$, wherein N and M are positive integers;
   an array of signal leads, $SL_{N,M}$;
   a transposing multiplexor for mapping pad $P_{i,j}$ to signal lead $SL_{i,j}$ when said integrated circuit is in a first transposition mode and for mapping pad $P_{i,j}$ to signal lead $SL_{(N-i+1),j}$ when said integrated circuit is in a second transposition mode;
   wherein i is all positive integers less than and including N; and
   wherein j is all positive integers less than and including M.

3. The integrated circuit of claim 2 wherein said transposing multiplexor further maps pad $P_{i,j}$ to signal lead $SL_{i,(M-j+1)}$ when said integrated circuit is in a third transposition mode.

4. The integrated circuit of claim 3 wherein said transposing multiplexor further maps pad $P_{i,j}$ to signal lead $SL_{(N-i+1),(M-j+1)}$ when said integrated circuit is in a fourth transposition mode.

5. The integrated circuit of claim 2 wherein said integrated circuit comprises a first transposition group and a second transposition group, and wherein said second transposition group is a non-empty proper subset of said first transposition group.

6. The integrated circuit of claim 2 wherein said integrated circuit comprises a first transposition group, a second transposition group, and a third transposition group, and wherein said second transposition group is a non-empty proper subset of said first transposition group and wherein said third transposition group is a non-empty proper subset of said first transposition group.

7. An integrated circuit comprising:
   an array of pads, P, for transporting an array of signal leads, S, wherein N and M are positive integers;
   a first transposition group that comprises a non-empty subset of said array of pads and that is characterized by the transposition matrix $T_1$; and
   a transposing multiplexor for mapping said array of pads, P, to said array of signal leads, S;
   wherein the mapping of said array of pads, P, to said array of signal leads, S, is P⇆S when said integrated circuit is in a first transposition mode; and wherein the mapping of said array of pads, P, to said array of signal leads, S, is $P \leftrightarrows S \circ T_1$ when said integrated circuit is in a second transposition mode.

8. The integrated circuit of claim 7 further comprising a second transposition group that comprises a second non-empty proper subset of said first transposition group and that is characterized by the transposition matrix $T_2$;

wherein the mapping of said array of pads, P, to said array of signal leads, S, is $P \leftrightarrows S \circ T_2$ when said integrated circuit is in a third transposition mode; and wherein the mapping of said array of pads, P, to said array of signal leads, S, is $P = S \circ T_1 \circ T_2$ when said integrated circuit is in a fourth transposition mode.

9. The integrated circuit of claim 8 further comprising a third transposition group that comprises a third non-empty proper subset of said first transposition group and that is characterized by the transposition matrix $T_3$;

wherein the mapping of said array of pads, P, to said array of signal leads, S, is $P = S \circ T_3$ when said integrated circuit is in a fifth transposition mode.

10. The integrated circuit of claim 9 wherein the mapping of said array of pads, P, to said array of signal leads, S, is $P = S \circ T_1 \circ T_3$ when said integrated circuit is in a sixth transposition mode;

wherein the mapping of said array of pads, P, to said array of signal leads, S, is $P = S \circ T_2 \circ T_3$ when said integrated circuit is in a seventh transposition mode; and wherein the mapping of said array of pads, P, to said array of signal leads, S, is $P = S \circ T_1 \circ T_2 \circ T_3$ when said integrated circuit is in an eighth transposition mode.

11. The integrated circuit of claim 9 wherein said second transposition group and said third transposition group are mutually exclusive.

12. The integrated circuit of claim 9 wherein said second transposition group and said third transposition group overlap.

13. The integrated circuit of claim 7 wherein said first transposition group comprises a proper subset of said array of pads.

14. The integrated circuit of claim 7 wherein said first transposition group comprises all of said array of pads.

* * * * *